(12) United States Patent
Huo et al.

(10) Patent No.: US 9,093,596 B2
(45) Date of Patent: Jul. 28, 2015

(54) EPITAXIAL WAFER FOR LIGHT EMITTING DIODE, LIGHT EMITTING DIODE CHIP AND METHODS FOR MANUFACTURING THE SAME

(75) Inventors: Dongming Huo, Guangdong (CN); Hongpo Hu, Guangdong (CN); Chunlin Xie, Guangdong (CN); Wang Zhang, Guangdong (CN)

(73) Assignee: BYD Company Limited, Shenzhen, Guangdong (CN)

( * ) Notice: Subject to any disclaimer, the term of this patent is extended or adjusted under 35 U.S.C. 154(b) by 0 days.

(21) Appl. No.: 13/536,784

(22) Filed: Jun. 28, 2012

(65) Prior Publication Data

US 2012/0267641 A1 Oct. 25, 2012

Related U.S. Application Data

(63) Continuation of application No. PCT/CN2010/078306, filed on Nov. 1, 2010.

(30) Foreign Application Priority Data

Dec. 31, 2009 (CN) .......................... 2009 1 0215397

(51) Int. Cl.
*H01L 33/14* (2010.01)
*H01L 33/08* (2010.01)
*H01L 27/15* (2006.01)

(52) U.S. Cl.
CPC ................ *H01L 33/14* (2013.01); *H01L 27/15* (2013.01); *H01L 33/08* (2013.01)

(58) Field of Classification Search
CPC ......... H01L 33/04; H01L 33/06; H01L 33/14; H01L 33/145; H01L 33/005; H01L 33/08
USPC .................. 438/22, 34; 257/79, 88, E33.001, 257/E33.011
See application file for complete search history.

(56) References Cited

U.S. PATENT DOCUMENTS 5,739,552 A * 4/1998 Kimura et al. .................. 257/89
6,466,597 B1 * 10/2002 Kume et al. ................ 372/45.01

(Continued)

FOREIGN PATENT DOCUMENTS

CN 1825642 A 8/2006
JP 51057297 A * 5/1976

(Continued)

OTHER PUBLICATIONS

"Visible Spectrum" (Lecture 4, slide 3), http://groups.csail.mit.edu/graphics/classes/6.837/F98/Lecture4/Slide03.html, (1998).*

(Continued)

*Primary Examiner* — Michele Fan
(74) *Attorney, Agent, or Firm* — Finnegan, Henderson, Farabow, Garrett & Dunner, LLP (57) ABSTRACT

An epitaxial wafer for a light emitting diode (LED) and a method for manufacturing the same are provided. The method comprises: providing a substrate; forming a first LED epitaxial structure on a first surface of the substrate, in which the first LED epitaxial structure comprises a first n-type semiconductor layer, a first light emitting layer, a first anti-diffusion layer between the first n-type semiconductor layer and the first light emitting layer, a first p-type semiconductor layer, and a second anti-diffusion layer between the first p-type semiconductor layer and the first light emitting layer; and forming a second LED epitaxial structure on a second surface of the substrate. An LED chip comprising the epitaxial wafer and a method for manufacturing the same are also provided.

11 Claims, 3 Drawing Sheets

(56) References Cited

U.S. PATENT DOCUMENTS

| | | | |
|---|---|---|---|
| 6,914,261 B2 * | 7/2005 | Ho | 257/79 |
| 7,994,524 B1 * | 8/2011 | Chung et al. | 257/90 |
| 8,895,155 B2 * | 11/2014 | Cina et al. | 428/690 |
| 2001/0050530 A1 * | 12/2001 | Murakami et al. | 313/498 |
| 2003/0136970 A1 * | 7/2003 | Takeya et al. | 257/90 |
| 2003/0230980 A1 * | 12/2003 | Forrest et al. | 313/600 |
| 2005/0123676 A1 * | 6/2005 | Kuwahara et al. | 427/66 |
| 2005/0189551 A1 * | 9/2005 | Peng et al. | 257/94 |
| 2006/0097242 A1 * | 5/2006 | Kuramoto | 257/13 |
| 2006/0227545 A1 * | 10/2006 | Mok et al. | 362/227 |
| 2007/0001588 A1 * | 1/2007 | Boroson et al. | 313/504 |
| 2007/0248132 A1 * | 10/2007 | Kikuchi et al. | 372/44.01 |
| 2009/0001391 A1 * | 1/2009 | Ogihara et al. | 257/89 |
| 2009/0140272 A1 * | 6/2009 | Beeson et al. | 257/89 |
| 2010/0008393 A1 * | 1/2010 | Enya et al. | 372/46.01 |
| 2010/0051975 A1 * | 3/2010 | Suzuki et al. | 257/89 |
| 2010/0142576 A1 * | 6/2010 | Cohen et al. | 372/45.01 |
| 2012/0261653 A1 * | 10/2012 | Okamoto | 257/40 |

FOREIGN PATENT DOCUMENTS

| | | | |
|---|---|---|---|
| JP | 62122190 A | * | 6/1987 |
| JP | 2004-88130 A | | 3/2004 |
| JP | 2006-135214 A | | 5/2006 |
| JP | 2007-288068 A | | 11/2007 |
| WO | WO 2009/104148 A1 | | 8/2009 |
| WO | WO 2011/079645 A1 | | 7/2011 |

OTHER PUBLICATIONS

First Chinese Office Action dated Sep. 26, 2012, issued in Chinese Application No. 200910215397.5 (6 pages).

PCT International Search Report and Written Opinion mailed Feb. 10, 2011, issued in International Application No. PCT/CN2010/078306 (11 pages).

* cited by examiner

Fig. 1

(Prior Art)

EPITAXIAL WAFER FOR LIGHT EMITTING DIODE, LIGHT EMITTING DIODE CHIP AND METHODS FOR MANUFACTURING THE SAME

CROSS-REFERENCE TO RELATED APPLICATION

This application is a continuation of International Application No. PCT/CN2010/078306, filed Nov. 1, 2010, which claims priority to Chinese Patent Application No. 200910215397.5, filed with the State Intellectual Property Office of People's Republic of China on Dec. 31, 2009, the entire contents of both of which are incorporated herein by reference.

FIELD

The present disclosure generally relates to the semiconductor field, and more particularly, to an epitaxial wafer for a light emitting diode, a light emitting diode chip and methods for manufacturing the same.

BACKGROUND

Figure 1:
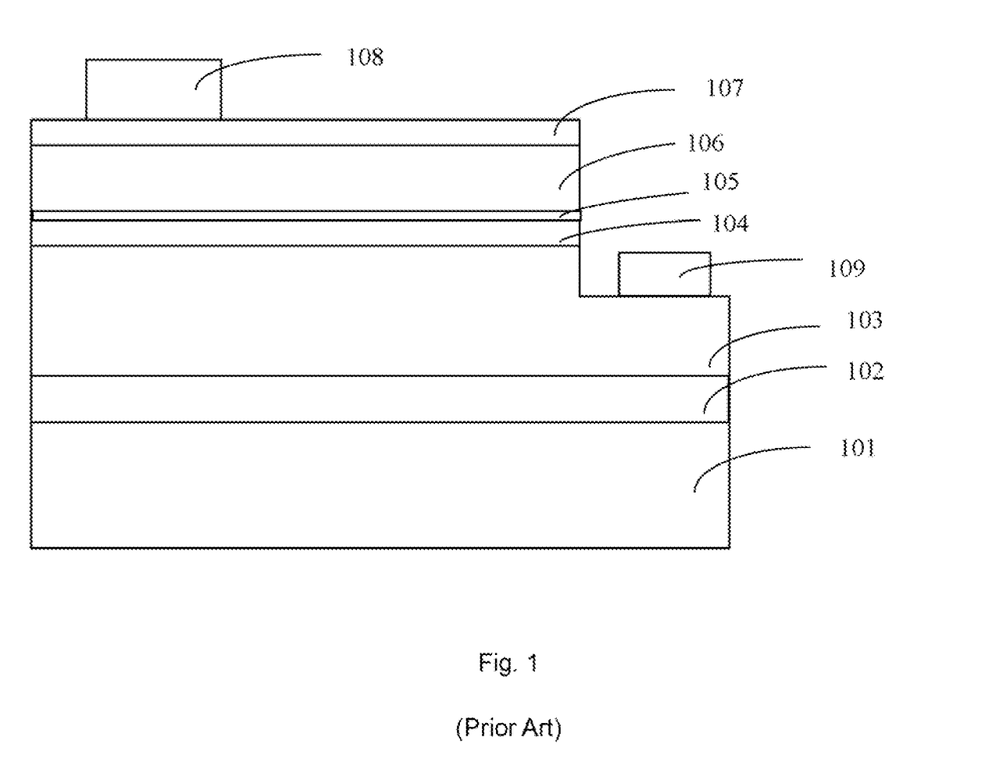
FIG. 1 is a cross-sectional view of a conventional LED chip.

Light emitting diodes (LEDs) are widely applied in the fields of display screens, backlights and special lighting. As shown in FIG. 1, an LED epitaxial wafer, as a core of an LED, may comprise a substrate 101, a buffer layer 102, an n-type semiconductor layer 103, a light emitting layer 104, an electron barrier layer 105 and a p-type semiconductor layer 106. The light emitting layer 104 may be disposed between the n-type semiconductor layer 103 and the p-type semiconductor layer 106 to form PN junctions. Conventionally, an LED chip may comprise the LED epitaxial wafer mentioned above, a current diffusing layer 107, a p-type electrode 108 and an n-type electrode 109.

Sapphire may be a conventional material for forming the substrate. The LED epitaxial wafer may be manufactured in a metal organic chemical vapor deposition device, using high purity hydrogen and nitrogen as carrier gas, and using high purity trimethyl gallium, trimethyl indium and ammonia as the Ga, In and N sources, respectively. The manufacturing method may comprise the steps of: forming a buffer layer on a substrate; forming an n-type gallium nitride layer on the buffer layer; forming a light emitting layer on the n-type gallium nitride layer, where the light emitting layer is an InGaN multi-quantum well layer; forming an electron barrier layer on the light emitting layer; and forming a p-type gallium nitride layer on the electron barrier layer.

The epitaxial wafer for the LED mentioned above may be a single wafer, that is, only one surface of the substrate may be used to form an LED epitaxial structure. It is a tremendous waste for LED manufacturing.

SUMMARY

An epitaxial wafer for a light emitting diode, a light emitting diode chip and methods for manufacturing the same are provided.

According to a first aspect of the present disclosure, a method for manufacturing an epitaxial wafer for a light emitting diode (LED) may be provided. The method may comprise:

providing a substrate;
forming a first LED epitaxial structure on a first surface of the substrate, in which the first LED epitaxial structure comprises:
a first n-type semiconductor layer,
a first light emitting layer,
a first anti-diffusion layer between the first n-type semiconductor layer and the first light emitting layer,
a first p-type semiconductor layer, and
a second anti-diffusion layer between the first p-type semiconductor layer and the first light emitting layer; and
forming a second LED epitaxial structure on a second surface of the substrate.

According to a second aspect of the present disclosure, an epitaxial wafer for a light emitting diode may be provided. The epitaxial wafer may comprise:

a substrate;
a first LED epitaxial structure formed on a first surface of the substrate, in which the first LED epitaxial structure comprises:
a first n-type semiconductor layer,
a first light emitting layer,
a first anti-diffusion layer between the first n-type semiconductor layer and the first light emitting layer,
a first p-type semiconductor layer, and
a second anti-diffusion layer between the first p-type semiconductor layer and the first light emitting layer; and
a second LED epitaxial structure formed on a second surface of the substrate.

According to a third aspect of the present disclosure, a method for manufacturing an LED chip may be provided. The method may comprise:

providing a substrate;
forming a first LED epitaxial structure on a first surface of the substrate, in which the first LED epitaxial structure comprises:
a first n-type semiconductor layer,
a first light emitting layer,
a first anti-diffusion layer between the first n-type semiconductor layer and the first light emitting layer,
a first p-type semiconductor layer, and
a second anti-diffusion layer between the first p-type semiconductor layer and the first light emitting layer;
forming a second LED epitaxial structure on a second surface of the substrate;
forming a first n-type electrode and a first p-type electrode on the first LED epitaxial structure;
forming a second n-type electrode and a second p-type electrode on the second LED epitaxial structure;
bonding one of the first LED epitaxial structure and the second LED epitaxial structure to a circuit base board; and
bonding the other of the first LED epitaxial structure and the second LED epitaxial structure to a heat conduction base board.

According to a fourth aspect of the present disclosure, an LED chip may be provided. The LED chip may comprise:

a substrate;
a first LED epitaxial structure formed on a first surface of the substrate, in which the first LED epitaxial structure comprises:
a first n-type semiconductor layer,
a first light emitting layer,
a first anti-diffusion layer between the first n-type semi-
conductor layer and the first light emitting layer, a first p-type semiconductor layer, and
a second anti-diffusion layer between the first p-type semiconductor layer and the first light emitting layer;
a second LED epitaxial structure formed on a second surface of the substrate;
a first n-type electrode and a first p-type electrode formed on the first LED epitaxial structure,
a second n-type electrode and a second p-type electrode formed on the second LED epitaxial structure;
a circuit base board to which one of the first LED epitaxial structure and the second LED epitaxial structure is bonded, and
a heat conduction base board to which the other of the first LED epitaxial structure and the second LED epitaxial structure is bonded.

According to some embodiments of the present disclosure, the first light emitting layer may be disposed between the first anti-diffusion layer and the second anti-diffusion layer, which may prevent doped impurities from diffusing to the first light emitting layer when the second LED epitaxial structure is formed on the second surface of the substrate. The LED chip provided herein may comprise two LED epitaxial structures, allowing adjustment of the color range of the LED and saving the cost of the substrate.

Additional aspects and advantages of the embodiments of present disclosure will be given in part in the following descriptions, become apparent in part from the following descriptions, or be learned from the practice of the embodiments of the present disclosure.

BRIEF DESCRIPTION OF THE DRAWINGS

The above and other features and advantages of the disclosure will be better understood from the following detailed descriptions taken in conjunction with the accompanying drawings, in which.

DETAILED DESCRIPTION OF THE EMBODIMENTS

Reference will be made in detail to embodiments of the present disclosure. The embodiments described herein with reference to drawings are explanatory, illustrative, and used to generally understand the present disclosure. The embodiments shall not be construed to limit the present disclosure.

In some embodiments of the present disclosure, an epitaxial wafer for an LED may be manufactured in a metal organic chemical vapor deposition device, using high purity hydrogen and nitrogen as carrier gas, and using high purity trimethyl gallium, trimethyl indium and ammonia as the Ga, In and N sources, respectively. In some embodiments, a method for manufacturing an epitaxial wafer for an LED may comprise the following steps.

Figure 2:
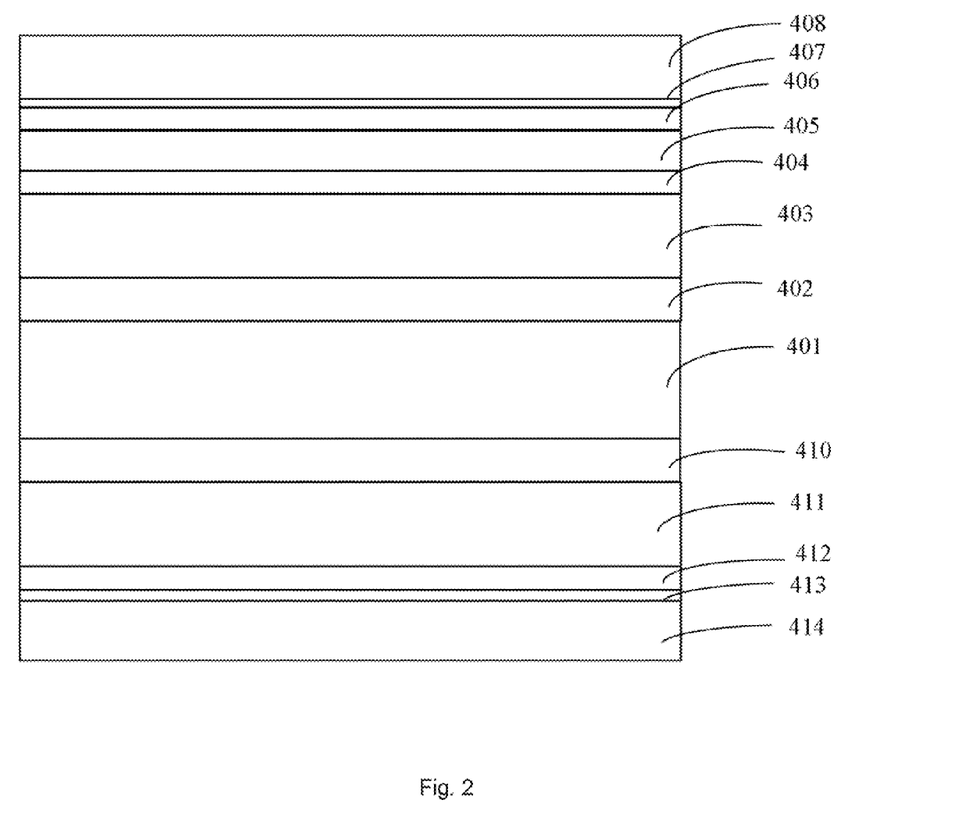
FIG. 2 is a cross-sectional view of an epitaxial wafer for an LED according to an embodiment of the present disclosure.

Step 201: In some embodiments as shown in FIG. 2, a first buffer layer 402 may be formed on a first surface of a substrate 401. In some embodiments, the substrate 401 may be made from, for example but not limited to, silicon (Si), silicon carbide (SiC), sapphire or zinc oxide (ZnO). In some embodiments, the substrate 401 may have a thickness ranging from about 80 μm to about 200 μm. In some embodiments, the first buffer layer 402 may have a thickness ranging from about 20 nm to about 30 nm. For different materials of the n-type semiconductor layer described herein, the thickness of the first buffer layer 402 may be adjusted. In some embodiments, the thickness of the substrate 401 may be less than the thickness of a conventional substrate when forming a single epitaxial wafer, in order to facilitate cutting of the epitaxial wafer during the subsequent chip manufacturing process.

Step 202: In some embodiments, a first n-type semiconductor layer 403 may be formed on the first buffer layer 402. In some embodiments, the first n-type semiconductor layer 403 may comprise III-V group compounds. In some embodiments, the III-V group compound may be chosen from, for example, GaN and GaAs. In some embodiments, the first n-type semiconductor layer 403 may be doped with an n-type impurity. In some embodiments, the n-type impurity may include, for example, silicon. In some embodiments, a source for providing silicon as the n-type impurity may include, for example, $SiH_4$. In some embodiments, the first n-type semiconductor layer 403 may have a thickness ranging from about 2 μm to about 4 μm.

Step 203: In some embodiments, a first anti-diffusion layer 404 may be formed on the first n-type semiconductor layer 403. In some embodiments, the first anti-diffusion layer 404 may comprise a nitride chosen from, for example but not limited to, GaN, InGaN and AlInGaN. In some embodiments, the first anti-diffusion layer 404 may have a thickness ranging from about 2 nm to about 20 nm.

Step 204: In some embodiments, a first light emitting layer 405 may be formed on the first anti-diffusion layer 404. In some embodiments, first light emitting layer 405 may be thus formed through epitaxial technology. In some embodiments, the first light emitting layer 405 may comprise a nitride chosen from, for example but not limited to, GaN, InGaN and AlInGaN, and may comprise a plurality of multi-quantum wells. The color of the light emitted by the first light emitting layer 405 comprising InGaN or AlInGaN may be determined by the band gap of the first light emitting layer 405, which may be determined by the content of indium in the multi-quantum wells. Therefore, the content of indium in InGaN, or the contents of aluminum and indium in AlInGaN may be adjusted to cause the first light emitting layer 405 to emit blue light.

Step 205: In some embodiments, a second anti-diffusion layer 406 may be formed on the first light emitting layer 405. In some embodiments, the second anti-diffusion layer 406 may comprise a nitride chosen from, for example but not limited to, GaN, InGaN and AlInGaN. In some embodiments of the present disclosure, the second anti-diffusion layer 406 may have a thickness ranging from about 2 nm to about 20 nm.

Step 206: In some embodiments, a first p-type semiconductor layer 408 may be formed on the second anti-diffusion layer 406 to form a first LED epitaxial structure. In some embodiments, the first p-type semiconductor layer 408 may comprise III-V group compounds. In some embodiments, the III-V group compound may be chosen from, for example, GaN and GaAs. In some embodiments, the first p-type semiconductor layer 408 may be doped with a p-type impurity. In some embodiments, the p-type impuirty may include, for example, magnesium. In some embodiments, a source for providing magnesium as the p-type impurity may include, for example, $CP_2Mg$. In some embodiments, the first p-type semiconductor layer 408 may have a thickness ranging from about 100 nm to about 300 nm.

Step 207: In some embodiments, the substrate 401 may be flipped.

Step 208: In some embodiments, a second buffer layer 410 may be formed on a second surface of the substrate 401. In some embodiments, the second surface of the substrate 401 may be opposite to the first surface thereof. In some embodiments, the second buffer layer 410 may have a thickness ranging from about 20 nm to about 30 nm. For different n-type semiconductor materials, the thickness of the second buffer layer 410 may be adjusted.

Step 209: In some embodiments, a second n-type semiconductor layer 411 may be formed on the second buffer layer 410. The second n-type semiconductor layer 411 may comprise III-V group compounds. In some embodiments, the III-V group compound may be chosen from, for example, GaN and GaAs. In some embodiments, second n-type semiconductor layer 411 may be doped with an n-type impurity. In some embodiments, the n-type impurity may include, for example, silicon. In some embodiments, a source for providing silicon as the n-type impurity may include, for example, $SiH_4$. In some embodiments, the second n-type semiconductor layer 411 may have a thickness ranging from about 2 μm to about 4 μm.

Step 210: In some embodiments, a second light emitting layer 412 may be formed on the second n-type semiconductor layer 411. In some embodiments, the second light emitting layer 412 may comprise a nitride chosen from, for example but not limited to, GaN, InGaN and AlInGaN, and may comprise a plurality of multi-quantum wells. The color of the light emitted by the second light emitting layer 412 comprising InGaN or AlInGaN may be determined by the band gap of the second light emitting layer 412, which may be determined by the content of indium in the multi-quantum wells. Therefore, the content of indium in InGaN, or the contents of aluminum and indium in AlInGaN may be adjusted to cause the second light emitting layer 412 to emit yellow light.

Step 211: In some embodiments, a second p-type semiconductor layer 414 may be formed on the second light emitting layer 412 to form a second LED epitaxial structure. In some embodiments, the second p-type semiconductor layer 414 may comprise III-V group compounds. In some embodiments, the III-V group compound may be chosen from, for example, GaN and GaAs. In some embodiments, the second p-type semiconductor layer 414 may be doped with a p-type impurity. In some embodiments, the p-type impuirty may include, for example, magnesium. In some embodiments, a source for providing magnesium as the p-type impurity may include, for example, $CP_2Mg$. In some embodiments, the second p-type semiconductor layer 414 may have a thickness ranging from about 100 nm to about 200 nm.

In some embodiments of the present disclosure, the first LED epitaxial structure may be formed on the first surface of the substrate 401, and the second LED epitaxial structure may be formed on the second surface of the substrate 401, so the utilization rate of the substrate may be improved. Because the two LED epitaxial structures may be independent, a two-color LED chip formed on one substrate may be achieved. In some embodiments of the present disclosure, the first light emitting layer 405 may emit blue light, and the second light emitting layer 412 may emit yellow light, so the LED chip comprising the first light emitting layer 405 and the second light emitting layer 412 may emit white light by adjusting the current passing through the first light emitting layer 405 and the second light emitting layer 412, respectively. In some embodiments of the present disclosure, the first light emitting layer 405 may emit yellow light, and the second light emitting layer 412 may emit blue light.

In some embodiments of the present disclosure, the LED epitaxial wafer described herein may be manufactured in a metal organic chemical vapor deposition device, using high purity hydrogen and nitrogen as carrier gas, and using high purity trimethyl gallium, trimethyl indium and ammonia as Ga, In and N sources, respectively. However, the manufacturing device is not limited to the metal organic chemical vapor deposition device. Any device which may achieve the manufacturing procedure may be used to manufacture the LED epitaxial wafer described herein.

In some embodiments of the present disclosure, the method for manufacturing the LED epitaxial wafer described herein may further comprise the step of forming a first electron barrier layer 407 on the second anti-diffusion layer 406. In some embodiments, the first electron barrier layer 407 may have a thickness ranging from about 20 nm to about 100 nm. The first electron barrier layer 407 may be configured to prevent the electron in the first light emitting layer 405 from diffusing to the first p-type semiconductor layer 408.

In some embodiments of the present disclosure, the method for manufacturing the LED epitaxial wafer may further comprise the step of forming a second electron barrier layer 413 between the second light emitting layer 412 and the second p-type semiconductor layer 414. In some embodiments, the second electron barrier layer 413 may have a thickness ranging from about 20 nm to about 100 nm. The second electron barrier layer 413 may be configured to prevent the electron in the second light emitting layer 412 from diffusing to the second p-type semiconductor layer 414.

As shown in FIG. 2, in some embodiments of the present disclosure, an LED epitaxial wafer may be provided. The LED epitaxial wafer may comprise:
  a substrate 401;
  a first buffer layer 402 formed on a first surface of the substrate 401;
  a first n-type semiconductor layer 403 formed on the first buffer layer 402;
  a first anti-diffusion layer 404 formed on the first n-type semiconductor layer 403;
  a first light emitting layer 405 formed on the first anti-diffusion layer 404;
  a second anti-diffusion layer 406 formed on the first light emitting layer 405;
  a first p-type semiconductor layer 408 formed on the second anti-diffusion layer 406;
  a second buffer layer 410 formed on a second surface of the substrate 401;
  a second n-type semiconductor layer 411 formed on the second buffer layer 410;
  a second light emitting layer 412 formed on the second n-type semiconductor layer 411; and
  a second p-type semiconductor layer 414 formed on the second light emitting layer 412.

In some embodiments of the present disclosure, a first LED epitaxial structure may comprise the first buffer layer 402, the first n-type semiconductor layer 403, the first anti-diffusion layer 404, the first light emitting layer 405, the second anti-diffusion layer 406, and the first p-type semiconductor layer 408.

In some embodiments of the present disclosure, a second LED epitaxial structure may comprise the second buffer layer 410, the second n-type semiconductor layer 411, the second light emitting layer 412, and the second p-type semiconductor layer 414.

In some embodiments of the present disclosure, the substrate 401 may be made from, for example but not limited to, Si, SiC, sapphire or ZnO. In some embodiments, the substrate 401 may have a thickness ranging from about 80 μm to about 200 μm. In some embodiments, the first buffer layer 402 may have a thickness ranging from about 20 nm to about 30 nm. In some embodiments of the present disclosure, the first n-type semiconductor layer 403 may comprise III-V group compounds. In some embodiments, the III-V group compound may be chosen from, for example, GaN and GaAs. In some embodiments, the first n-type semiconductor layer 403 may be doped with an n-type impurity. In some embodiments, the n-type impurity may include, for example, silicon. In some embodiments, the first n-type semiconductor layer 403 may have a thickness ranging from about 2 µm to about 4 µm. In some embodiments of the present disclosure, the first anti-diffusion layer 404 may comprise a nitride chosen from, for example but not limited to, GaN, InGaN and AlInGaN. In some embodiments, the first anti-diffusion layer 404 may have a thickness ranging from about 2 to about 20 nm. In some embodiments of the present disclosure, the first light emitting layer 405 may comprise a nitride chosen from, for example but not limited to, GaN, InGaN and AlInGaN, and may comprise a plurality of multi-quantum wells. The color of the light emitted by the first light emitting layer 405 comprising InGaN or AlInGaN may be determined by the content of the indium. In some embodiments of the present disclosure, the second anti-diffusion layer 406 may comprise a nitride chosen from, for example but not limited to, GaN, InGaN and AlInGaN. In some embodiments, the second anti-diffusion layer 406 may have a thickness ranging from about 2 nm to about 20 nm. In some embodiments of the present disclosure, the first p-type semiconductor layer 408 may comprise III-V group compounds. In some embodiments, the III-V group compound may be chosen from, for example, GaN and GaAs. In some embodiments, the first p-type semiconductor layer 408 may be doped with a p-type impurity. In some embodiments, the p-type impurity may include, for example, magnesium. In some embodiments, the first p-type semiconductor layer 408 may have a thickness ranging from about 100 nm to about 300 nm.

In some embodiments of the present disclosure, the second buffer layer 410 may have a thickness ranging from about 20 nm to about 30 nm. In some embodiments of the present disclosure, the second n-type semiconductor layer 411 may comprise III-V group compounds. In some embodiments, the III-V group compound may be chosen from, for example, GaN and GaAs. In some embodiments, the second n-type semiconductor layer 411 may be doped with an n-type impurity. In some embodiments, the n-type impurity may include, for example, silicon. In some embodiments, the second n-type semiconductor layer 411 may have a thickness ranging from about 2 µm to about 4 µm. In some embodiments of the present disclosure, the second light emitting layer 412 may comprise a nitride chosen from, for example but not limited to, GaN, InGaN and AlInGaN, and may comprise a plurality of multi-quantum wells. The color of the light emitted by the second light emitting layer 412 comprising InGaN or AlInGaN may be determined by the content of the indium. In some embodiments of the present disclosure, the second p-type semiconductor layer 414 may comprise III-V group compounds. In some embodiments, the III-V group compound may be chosen from, for example, GaN and GaAs. In some embodiments, the second p-type semiconductor layer 414 may be doped with a p-type impurity. In some embodiments, the p-type impurity may include, for example, magnesium. In some embodiments, the first p-type semiconductor layer may have a thickness ranging from about 100 nm to about 200 nm.

In some embodiments of the present disclosure, the LED epitaxial wafer may further comprise a first electron barrier layer 407 formed on the second anti-diffusion layer 406. In some embodiments, the first electron barrier layer 407 may have a thickness ranging from about 20 nm to about 100 nm. The first electron barrier layer 407 may be configured to prevent the electron in the first light emitting layer 405 from diffusing to the first p-type semiconductor layer 408.

In some embodiments of the present disclosure, the LED epitaxial wafer may further comprise a second electron barrier layer 413 formed between the second light emitting layer 412 and the second p-type semiconductor layer 414. In some embodiments, the second electron barrier layer 413 may have a thickness ranging from about 20 nm to about 100 nm. The second electron barrier layer 413 may be configured to prevent the electron in the second light emitting layer 412 from diffusing to the second p-type semiconductor layer 414.

In some embodiments of the present disclosure, a method for manufacturing an LED chip may be provided. The method may comprise:
    forming a first buffer layer on a first surface of a substrate;
    forming a first n-type semiconductor layer on the first buffer layer;
    forming a first anti-diffusion layer on the first n-type semiconductor layer;
    forming a first light emitting layer on the first anti-diffusion layer;
    forming a second anti-diffusion layer on the first light emitting layer;
    forming a first p-type semiconductor layer on the second anti-diffusion layer;
    flipping the substrate;
    forming a second buffer layer on a second surface of the substrate;
    forming a second n-type semiconductor layer on the second buffer layer;
    forming a second light emitting layer on the second n-type semiconductor layer;
    forming a second p-type semiconductor layer on the second light emitting layer;
    partially etching the first p-type semiconductor layer, the second anti-diffusion layer, the first light emitting layer and the first anti-diffusion layer to expose a part of the first n-type semiconductor layer;
    forming a first n-type electrode on the exposed part of the first n-type semiconductor layer and forming a first p-type electrode on the first p-type semiconductor layer;
    partially etching the second p-type semiconductor layer and the second light emitting layer to expose a part of the second n-type semiconductor layer; and
    forming a second n-type electrode on the exposed part of the second n-type semiconductor layer and forming a second p-type electrode on the second p-type semiconductor layer.

In some embodiments of the present disclosure, the materials of the substrate, the first buffer layer, the first n-type semiconductor layer, the first anti-diffusion layer, the first light emitting layer, the second anti-diffusion layer, the first p-type semiconductor layer, the second buffer layer, the second n-type semiconductor layer, the second light emitting layer, and the second p-type semiconductor layer may be the same as described above.

In some embodiments of the present disclosure, the method for manufacturing the LED chip may further comprise a step of forming a first electron barrier layer on the second anti-diffusion layer. In some embodiments, the first electron barrier layer may have a thickness ranging from about 20 nm to about 100 nm. The first electron barrier layer may be configured to prevent the electron in the first light emitting layer from diffusing to the first p-type semiconductor layer.

In some embodiments of the present disclosure, the method for manufacturing the LED chip may further comprises a step of forming a second electron barrier layer between the second light emitting layer and the second p-type semiconductor layer. In some embodiments, the second electron barrier layer may have a thickness ranging from about 20 nm to about 100 nm. The second electron barrier layer may be configured to prevent the electron in the second light emitting layer from diffusing to the second p-type semiconductor layer.

In some embodiments of the present disclosure, the method for manufacturing the LED chip may further comprise a step of forming a current diffusing layer on the first p-type semiconductor layer. The current diffusing layer may be configured to average the distribution of the current in the first p-type semiconductor layer.

In some embodiments of the present disclosure, the method for manufacturing the LED chip may further comprise a step of forming a reflecting layer on the second p-type semiconductor layer. The reflecting layer may be configured to reflect the light emitted to the second p-type semiconductor layer. In some embodiments, the reflecting layer may comprise, for example but not limited to, silver, aluminum, or a distributed Bragg reflector which may comprise a plurality of first refractive index media and a plurality of second refractive index media distributed alternatively, in which the refractive index of the first refractive index medium may be lower than that of the second refractive index medium.

In some embodiments of the present disclosure, the method for manufacturing the LED chip may further comprise bonding the first n-type electrode and the first p-type electrode to a heat conduction base board. In some embodiments, the bonding may be conducted by flip-soldering. In some embodiments, the flip-soldering may be conducted by a eutectic welding technology. In some embodiments, the method for manufacturing the LED chip may further comprise bonding the second n-type electrode and the second p-type electrode to a circuit base board. In some embodiments, the bonding may be conducted via wires.

In some embodiments of the present disclosure, the method for manufacturing the LED chip may further comprise bonding the second n-type electrode and the second p-type electrode to a heat conduction base board. In some embodiments, the bonding may be conducted by flip-soldering. In some embodiments, the flip-soldering may be conducted by a eutectic welding technology. In some embodiments, the method for manufacturing the LED chip may further comprise bonding the first n-type electrode and the first p-type electrode to a circuit base board. In some embodiments, the bonding may be conducted via wires.

Figure 3:
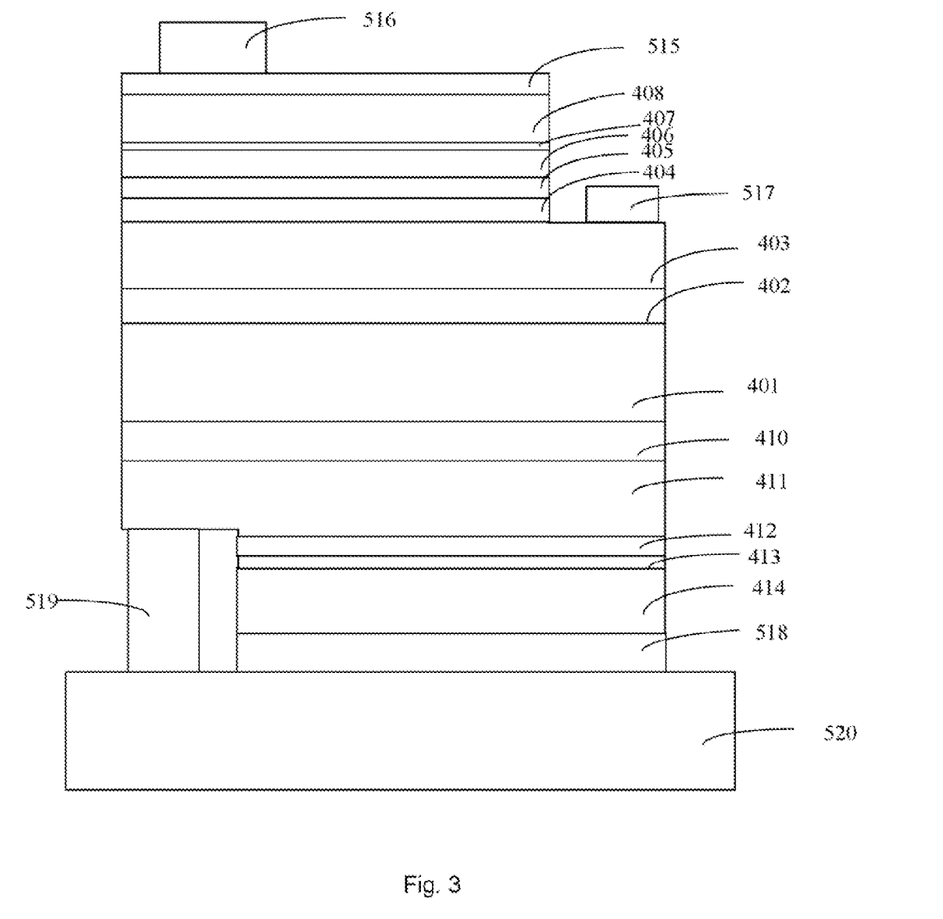
FIG. 3 is a cross-sectional view of an LED chip according to an embodiment of the present disclosure.

As shown in FIG. 3, in some embodiments of the present disclosure, an LED chip with two LED epitaxial structures may be provided. The LED chip may comprise:
- a substrate 401;
- a first buffer layer 402 formed on a first surface of the substrate 401;
- a first n-type semiconductor layer 403 formed on the first buffer layer 402;
- a first anti-diffusion layer 404 formed on the first n-type semiconductor layer 403;
- a first light emitting layer 405 formed on the first anti-diffusion layer 404;
- a second anti-diffusion layer 406 formed on the first light emitting layer 405;
- a first p-type semiconductor layer 408 formed on the second anti-diffusion layer 406;
- a first p-type electrode 516 formed on the first p-type semiconductor layer 408;
- a first n-type electrode 517 formed on the first n-type semiconductor layer 403;
- a second buffer layer 410 formed on a second surface of the substrate 401;
- a second n-type semiconductor layer 411 formed on the second buffer layer 410;
- a second light emitting layer 412 formed on the second n-type semiconductor layer 411;
- a second p-type semiconductor layer 414 formed on the second light emitting layer 412;
- a second p-type electrode 518 formed on the second p-type semiconductor layer 414; and
- a second n-type electrode 519 formed on the second n-type semiconductor layer 411.

In some embodiments of the present disclosure, the materials of the substrate, the first buffer layer, the first n-type semiconductor layer, the first anti-diffusion layer, the first light emitting layer, the second anti-diffusion layer, the first p-type semiconductor layer, the second buffer layer, the second n-type semiconductor layer, the second light emitting layer, and the second p-type semiconductor layer may be the same as described above.

In some embodiments of the present disclosure, the LED chip may further comprise a first electron barrier layer 407 formed on the second anti-diffusion layer 406. In some embodiments, the first electron barrier layer 407 may have a thickness ranging from about 20 nm to about 100 nm. The first electron barrier layer 407 may be configured to prevent the electron in the first light emitting layer 405 from diffusing to the first p-type semiconductor layer 408.

In some embodiments of the present disclosure, the LED chip may further comprise a second electron barrier layer 413 formed on the second light emitting layer 412. In some embodiments, the second electron barrier layer 413 may have a thickness ranging from about 20 nm to about 100 nm. The second electron barrier layer 413 may be configured to prevent the electron in the second light emitting layer 412 from diffusing to the second p-type semiconductor layer 414.

In some embodiments of the present disclosure, the LED chip may further comprise a current diffusing layer 515 formed on the first p-type semiconductor layer 408. The current diffusing layer 515 may be configured to average the distribution of the current in the first p-type semiconductor layer 408.

In some embodiments of the present disclosure, the LED chip may further comprise a reflecting layer (not shown in FIG. 3) formed on the second p-type semiconductor layer 414. The reflecting layer may be configured to reflect the light emitted to the second p-type semiconductor layer 414. The reflecting layer may be comprise, for example but not limited to, silver, aluminum, or a distributed Bragg reflector which comprises a plurality of first refractive index media and a plurality of second refractive index media distributed alternatively, in which the refractive index of the first refractive index medium may be lower than that of the second refractive index medium.

In some embodiments of the present disclosure, the first n-type electrode and the first p-type electrode may be bonded to a heat conduction base board 520. In some embodiments, the bonding to the heat conduction base board 520 may be conducted by a eutectic welding technology. In some embodiments, the second n-type electrode and the second p-type electrode may be bonded to a circuit base board (not shown in FIG. 3). In some embodiments, the bonding to the circuit base board may be conducted via wires.

In some embodiments of the present disclosure, the second n-type electrode and the second p-type electrode may be bonded to a heat conduction base board 520. In some embodiments, the bonding to the heat conduction base board 520 may be conducted by a eutectic welding technology. In some embodiments, the first n-type electrode and the first p-type electrode may be bonded to a circuit base board (not shown in FIG. 3). In some embodiments, the bonding to the circuit base board may be conducted via wires.

Therefore, the light outlet surface of the first LED epitaxial structure may be the first p-type semiconductor layer, and the light outlet surface of the second LED epitaxial structure may be the substrate. In some embodiments of the present disclosure, after current is applied to the first light emitting layer and the second light emitting layer respectively, the first light emitting layer may be modulated to emit blue light, and the second light emitting layer may be modulated to emit yellow light. By controlling the current intensity passing through the first light emitting layer and the second light emitting layer to adjust the ratio of the blue light and the yellow light, the LED chip may emit white light with different color temperatures. Thus, a white light LED chip with no phosphors may be achieved.

In some embodiments of the present disclosure, the first light emitting layer may emit light other than blue light, and the second light emitting layer may emit light other than yellow light.

According to some embodiments of the present disclosure, the first light emitting layer may be formed between the first anti-diffusion layer and the second anti-diffusion layer, which may prevent the doped impurities from diffusing to the first light emitting layer when the second LED epitaxial structure is formed on the second surface of the substrate. The LED chip may thus comprise two LED epitaxial structures, allowing adjustment of the color range and saving the cost of the substrate.

Although explanatory embodiments have been shown and described, it would be appreciated by those skilled in the art that changes, alternatives, and modifications can be made in the embodiments without departing from spirit and principles of the disclosure. Such changes, alternatives, and modifications all fall into the scope of the claims and their equivalents.

What is claimed is:

1. An epitaxial wafer for a light emitting diode, said epitaxial wafer comprising:
a substrate;
a first LED epitaxial structure formed on a first surface of the substrate, in which the first LED epitaxial structure comprises:
a first n-type semiconductor layer doped with n-type impurities,
a first light emitting layer,
a first anti-diffusion layer between the first n-type semiconductor layer and the first light emitting layer, the first anti-diffusion layer being formed directly on the first n-type semiconductor layer,
a second anti-diffusion layer,
a first electron barrier layer directly on the second anti-diffusion layer, and
a first p-type semiconductor layer doped with p-type impurities on the first electron barrier layer, wherein the first and second anti-diffusion layers are adapted to block respectively the n-type and p-type impurities from diffusing to the first light emitting layer; and
a second LED epitaxial structure formed on a second surface of the substrate.

2. The epitaxial wafer according to claim 1, wherein the first LED epitaxial structure further comprises a first buffer layer formed between the first surface of the substrate and the first n-type semiconductor layer.

3. The epitaxial wafer according to claim 2, wherein the first anti-diffusion layer and the second anti-diffusion layer comprise independently a nitride chosen from GaN, InGaN and AlGaInN.

4. The epitaxial wafer according to claim 1, wherein the second LED epitaxial structure comprises:
a second buffer layer formed on the second surface of the substrate;
a second n-type semiconductor layer formed on the second buffer layer;
a second light emitting layer formed on the second n-type semiconductor layer; and
a second p-type semiconductor layer formed on the second light emitting layer.

5. The epitaxial wafer according to claim 1, wherein the substrate is made of sapphire, and wherein the substrate has a thickness ranging from about 80 μm to about 200 μm.

6. The epitaxial wafer according to claim 1, wherein the first anti-diffusion layer and the second anti-diffusion layer have independently a thickness ranging from about 2 nm to about 20 nm.

7. A light emitting diode (LED) chip, comprising:
a substrate;
a first LED epitaxial structure formed on a first surface of the substrate, wherein the first LED epitaxial structure comprises:
a first n-type semiconductor layer doped with n-type impurities,
a first light emitting layer,
a first anti-diffusion layer between the first n-type semiconductor layer and the first light emitting layer, the first anti-diffusion layer being formed directly on the first n-type semiconductor layer,
a second anti-diffusion layer,
a first electron barrier layer directly on the second anti-diffusion layer, and
a first p-type semiconductor layer doped with p-type impurities on the first electron barrier layer, wherein the first and second anti-diffusion layers are adapted to block respectively the n-type and p-type impurities from diffusing to the first light emitting layer;
a second LED epitaxial structure formed on a second surface of the substrate;
a first n-type electrode and a first p-type electrode formed on the first LED epitaxial structure;
a second n-type electrode and a second p-type electrode formed on the second LED epitaxial structure;
a circuit base board to which one of the first LED epitaxial structure and the second LED epitaxial structure is bonded; and
a heat conduction base board to which the other of the first LED epitaxial structure and the second LED epitaxial structure is bonded.

8. The LED chip according to claim 7, wherein the first LED epitaxial structure emits blue light, and the second LED epitaxial structure emits yellow light; or
wherein the first LED epitaxial structure emits yellow light, and the second LED epitaxial structure emits blue light.

9. The LED chip according to claim 7, wherein the substrate is made of sapphire, and wherein the substrate has a thickness ranging from about 80 μm to about 200 μm.

10. The LED chip according to claim 7, wherein the first anti-diffusion layer and the second anti-diffusion layer comprise independently a nitride chosen from GaN, InGaN and AlGaInN.

11. The LED chip according to claim 7, wherein the first anti-diffusion layer and the second anti-diffusion layer have independently a thickness ranging from about 2 nm to about 20 nm.

* * * * *